United States Patent [19]

Pei et al.

[11] Patent Number: 5,682,043
[45] Date of Patent: Oct. 28, 1997

[54] ELECTROCHEMICAL LIGHT-EMITTING DEVICES

[75] Inventors: Qibing Pei; Floyd L. Klavetter, both of Santa Barbara, Calif.

[73] Assignee: Uniax Corporation, Santa Barbara, Calif.

[21] Appl. No.: 268,763

[22] Filed: Jun. 28, 1994

[51] Int. Cl.[6] .................... H01L 35/24; H01L 51/00
[52] U.S. Cl. .................... 257/40; 257/102; 257/103; 313/498; 313/504
[58] Field of Search .................... 257/102, 103, 257/40; 313/498, 504

[56] References Cited

U.S. PATENT DOCUMENTS

| | | | |
|---|---|---|---|
| 3,404,304 | 10/1968 | Bonin et al. | 313/108 |
| 3,701,043 | 10/1972 | Zuleeg et al. | 331/94.5 |
| 3,900,418 | 8/1975 | Bard et al. | |
| 4,442,187 | 4/1984 | MacDiarmid et al. | 429/213 |
| 4,522,901 | 6/1985 | Shacklette | 429/194 |
| 4,539,507 | 9/1985 | VanSlyke et al. | |
| 4,721,601 | 1/1988 | Wrighton et al. | 422/68 |
| 4,781,443 | 11/1988 | Giles | 350/357 |
| 5,142,343 | 8/1992 | Hosokawa et al. | 357/17 |
| 5,153,681 | 10/1992 | Kishimoto et al. | 357/8 |
| 5,155,566 | 10/1992 | Nakayama et al. | 357/30 |
| 5,189,549 | 2/1993 | Leventis et al. | |
| 5,247,190 | 9/1993 | Friend et al. | |
| 5,250,820 | 10/1993 | Sawase et al. | 257/99 |
| 5,258,629 | 11/1993 | Itoh et al. | 257/88 |
| 5,349,209 | 9/1994 | Moyer et al. | 257/80 |
| 5,378,404 | 1/1995 | Han et al. | 252/500 |
| 5,408,109 | 4/1995 | Heeger et al. | 257/40 |
| 5,446,577 | 8/1995 | Bennett et al. | 359/273 |
| 5,597,890 | 1/1997 | Jenekhe | 528/397 |

FOREIGN PATENT DOCUMENTS

| | | |
|---|---|---|
| 59-188181 | 10/1984 | Japan . |
| WO 95/24056 | 9/1995 | WIPO . |

*Primary Examiner*—Sara W. Crane
*Attorney, Agent, or Firm*—Burns, Doane, Swecker & Mathis, L.L.P.

[57] ABSTRACT

Electrochemical light emitting devices are disclosed which include a composite material in contact with two electrodes. The composite material is an admixture of ionic species and an 'immobile' semiconductor. The semiconductor is capable of supporting both p- and n-type carriers and having a doping profile which can be dynamically changed in a controlled fashion through reversible electrochemical oxidation and reduction. Devices having this structure may be used to generate electrochemically induced p-n junctions, thereby providing a new means of exploiting the light emitting properties of such junctions under an applied voltage. Systems and methods for generating useful levels of light employing these devices are also disclosed.

58 Claims, 4 Drawing Sheets

ELECTROCHEMICAL LIGHT-EMITTING DEVICES

FIELD OF THE INVENTION

The present invention relates to electrochemical light emitting devices and their use to generate useful levels of light, and in particular to such devices in which the light emitting device includes a thin layer made up of electrolyte and semiconductor.

BACKGROUND OF THE INVENTION

The semiconductor light emitting diode is a p-n junction specially fabricated to emit light under an applied voltage. In conventional inorganic semiconductor devices a p-n junction consists of a single crystal semiconductor formed such that part of the crystal is doped with positively charged carriers called p-type and the other part is doped with negatively charged carriers called n-type. It is a basic feature of all such junctions that their chemical composition and, hence, doping profile are static, or fixed in position in the host crystal. During operation in a device charge carriers are injected into, or removed from, the junction through electrical contacts external to the junction region. Abrupt junctions, in which the transition between the n- and p-type regions is relatively narrow, are typically fabricated by alloying a solid impurity (for example, a metal) with the semiconductor, or by one of a number of epitaxial growth techniques on crystalline semiconductor substrates; graded junctions, in which the transition region is relatively broader, are produced by diffusion or ion implantation of impurities into the host semiconductor. These technologically demanding manufacturing processes make it both difficult and expensive to fabricate large area displays. Moreover, such devices are inherently brittle and lack the mechanical and processing advantages generally associated with organic, and especially polymeric materials. For these reasons, there has been considerable interest for many years in the development of suitable organic materials for use as the active (light-emitting) components of light emitting diodes.

More recently, a number of workers have disclosed electroluminescent devices using organic materials as the active light emitting layer in sandwich architecture devices. For example, S. A. Van Slyke and C. W. Tang in U.S. Pat. No. 4,539,507 disclosed a device consisting of a bilayer of two vacuum sublimed films of small organic molecules sandwiched between two contacts, while R. H. Friend et al. in U.S. Pat. No. 5,247,190 disclosed a device consisting of a thin dense polymer film comprising at least one conjugated polymer sandwiched between two contacts. Because these are electric field driven devices, the active electroluminescent layer must be very thin (about 1000 thick or less) and uniform. In these devices excess charge carriers are injected through the contacts into the light emitting semiconductor layer by processes well known in the study of metal-semiconductor interfaces [see, e.g., M. A. Lampert and P. Mark, *Current Injection in Solids*, Academic Press, NY, 1970]. Dissimilar metals were used for the contacts to facilitate the injection of electrons at one contact and of holes at the other. As a result the current-voltage characteristic curves of these devices show a pronounced asymmetry with respect to the polarity of the applied voltage, like that typical of the response of diodes. Hence, the rectification ratio of such devices is high, typically greater than $10^3$, and light is emitted for only one polarity of the applied voltage. Among other drawbacks, the devices disclosed by S. A. Van Slyke and C. W. Tang and by Friend et al. suffer from the need to use metals of relatively low work function to inject sufficient numbers of electrons into the active layers to produce efficient light output at low drive voltages. Because such metals are readily oxidized, they are a source of device degradation in ambient conditions and require passivating packaging.

Electrochemistry provides a convenient means of reversibly doping a number of semiconductors with n- and p-type carriers. This carrier injection mechanism is physically distinct from that in the sandwich architecture electroluminescent devices disclosed by S. A. Van Slyke and C. W. Tang and by Friend et al. In particular, in the case of electrochemical doping the charge carriers generated are compensated by counter-ions from the electrolyte. However, the mobility of these carriers is often too low for practical use. This is believed to be due to the fact that in a semiconductor in contact with an electrolyte, subsequent to an electrochemical oxidation or reduction reaction, the charge carrying species generated are typically ionically bound to a counter-ion from the electrolyte. The electrochemical generation of the charge carriers therefore necessarily also involves incorporation of the compensating counter-ions within the semiconductor. The often dense morphology of many semiconductors inhibits the diffusion of the counter-ions, leading to slow doping and undoping kinetics.

Semiconducting polymers offer particular advantages as electronic materials. These materials exhibit the electrical and optical properties of semiconductors in combination with the processing advantages and mechanical properties of polymers. Inorganic crystalline devices, in contrast with many polymer materials and objects, are mechanically brittle. Semiconducting polymers can often be doped by chemical means with relative ease, and the dopant species can often diffuse into the anisotropic polymer structure at room temperature. Alternatively, the doping can often be carried out electrochemically as a redox reaction, and the doping level controlled by the applied electrochemical potential with respect to a counter-electrode. Although useful as electrodes in battery applications, electrochromic devices, and the like, such electrochemically doped materials have not been considered suitable for semiconductor device applications since the dopant species are mobile at room temperature. As a result, any doping profile (such as that needed for forming a p-n junction) is necessarily transient.

The electrochemiluminescent cell, a device for generating light using the reversible oxidation-reduction reactions of organic or metallo-organic species in an electrochemical cell, is disclosed by A. J. Bard et al. in U.S. Pat. No. 3,900,418. As in the present invention, electrochemiluminescent devices produce light by electron transfer reactions between electrogenerated species. The devices disclosed by Bard et al. rely on an organic solvent containing the electrolyte to transport the oxidized or reduced light emitting molecules themselves, rather than the excitations, between the electrodes. The oxidized and reduced species react with each other to form the original organic or metallo-organic species in an electronically excited state which may subsequently decay radiatively. N. Levantis and M. S. Wrighton in U.S. Pat. No. 5,189,549 disclose electrochemiluminescent displays in which the electrochemiluminescent substance is dissolved in a solid electrolyte. Again, N. Levantis and M. S. Wrighton disclose that after generation of the oxidized and reduced species, said species diffuse away from their generation sources (i.e. the electrodes) and eventually meet somewhere between the electrodes. Alternatively, other workers have found that an electrochemiluminescent material can be fixed on one of the electrodes in an electrochemical cell and cyclically reduced and oxidized by an alternating potential. A direct current potential can be used only if the cell contains an additional species which serves to interact with the luminescing material in such a way as either to oxidize it at the same potential at which it is electrochemically reduced or to reduce it at the same potential at which it is electrochemically oxidized [see, e.g., M. M. Richter et al., to be published in *Chem. Phys. Lett.*]. A key disadvantage of many of these electrochemiluminescent devices is the large volume of organic solvent relative to the quantity of the electrochemiluminescent material, said volume of organic solvent being a source of reactants whose electrochemical side reaction products act to quench the recombination radiation. The use of the solvent is also a disadvantage from the point of view of the fabrication and packaging of such devices. In solid electrolytes, such as polymer electrolytes, the diffusion rate of the oxidized and reduced species are substantially lower, which compromises device performance.

Thus, a need exists for light-emitting devices which are efficient and operate at low voltages, which can be economically manufactured, which can be fabricated into large areas, and which can be fabricated without the need of employing and encapsulating large amounts of solvents.

SUMMARY OF THE INVENTION

The present invention provides an electrochemical light emitting device. The device of the invention includes a composite material in contact with two electrodes. The composite material is an admixture of ionic species and an 'immobile' semiconductor. The semiconductor is capable of supporting both p- and n-type carriers and having a doping profile which can be dynamically changed in a controlled fashion through reversible electrochemical oxidation and reduction. Devices having this structure may be used to generate electrochemically induced p-n junctions, thereby providing a new means of exploiting the light emitting properties of such junctions under an applied voltage.

(The adjectives 'a' or 'an' are employed when describing elements and components of the invention. This is done merely for convenience and to give a general sense of the invention. Certainly, mixtures of materials may be used and this description should be read to include one or at least one and the singular also includes plural unless it is obvious that it is meant otherwise.)

The term 'immobile' is also employed. By 'immobile' is meant that the oxidized or reduced regions of the semiconductor do not physically move from one electrode to the other, but rather it is the p- and n-type carriers which move within the semiconductor.

Thus in one aspect this invention provides an electrochemical light emitting device made up of a pair of contact layers held in a spaced relationship to one another by an admixed composite thin layer. This thin layer contains an immobile semiconductor and an ionic species source. When a powering voltage is applied between the first and second contacts the semiconductor is electrochemically reduced at the cathode to form negatively charged excitations and electrochemically oxidized at the anode to form positively charged excitations. These excitations propagated within the layer under the influence of the applied voltage and combine in the layer to form charge carrier pairs which decay radiatively so that radiation is emitted from the layer.

In one preferred aspect the immobile semiconductor is an organic semiconductor and the mixture of semiconductor and ionic species source is in the form of an open connected network of organic semiconductor filled with the ionic species source.

In other preferred aspects the semiconductor is an organic polymeric or oligomeric semiconductor, especially a conjugated material, although non-conjugated polymer comprising π-conjugated moieties and gel materials and laser dyes and polymers and oligomers containing laser dye moieties are within the contemplation of the invention.

An ionic species source is present in the composite layer of the devices of the invention. This can be admixed salt. This admixed salt can be alone but preferably is a polymeric electrolyte made up of a mixture of electrolyte polymer and salt. Thus in some preferred embodiments the layer of composite material may include a polymer electrolyte and an organic semiconductor selected from the group consisting of organic small molecules, monomers, prepolymers, oligomers and polymers, and mixtures thereof.

In yet another aspect the thin layer contains a block or random copolymer containing segments which provide immobile semiconductor regions and segments which are an ionic species source.

In yet another preferred embodiment of the light emitting device, the layer of composite material includes a semiconductor containing at least one conjugated polymer or co-polymer which contains segments of p-conjugated moieties.

In another still further preferred embodiment, the layer of composite material is a mixture of polymer electrolyte and organic semiconductor or semiconducting polymer, the organic semiconductor or semiconducting polymer forming an open connected network of low density within the supporting polymer solid electrolyte.

In another aspect this invention provides devices of the type described wherein at least one of the contact layers is substantially transparent at the wavelength at which the device emits light and the light is emitted through this layer.

In yet another aspect the thin layer contains a block or random copolymer containing segments which provide immobile semiconductor regions and segments which are an ionic species source.

In most embodiments of the invention the device is in contact with and supported by a supporting substrate. The device can take the form of a thin film or as a filament or the like.

In addition to being embodied as a light-emitting device this invention can take the form of a system for light emission. This system includes a device of the type described in combination with a power supply applying an effective powering voltage across the pair of anode and cathode contact layers. The effective powering voltage reduces the immobile semiconductor at the cathode to form negatively charged excitations and oxidizes the immobile semiconductor at the anode to form positively charged excitations. These negatively charged excitations and positively charged excitations propagate in the thin layer under the influence of the applied voltage and combining to form charge carrier pairs which decay radiatively in the thin layer so that light is emitted from the layer.

In yet a further aspect, this invention provides a process for generating useful levels of light. This process involves applying an effective powering voltage across the electrodes of the system just described, causing the system to emit light and using the light so emitted for, for example, illumination or display purposes. The light so emitted and used can be polarized, if desired.

DETAILED DESCRIPTION OF THE INVENTION

The invention is based on the discovery that a blend of an 'immobile' semiconducting material with ionic species, when supported between two electrodes and upon application of a small voltage, functions as a p-n junction and may emit light. This observation is a completely unexpected result, as one skilled in the art would anticipate that such a device would cause the semiconducting polymer to be doped to a conducting state, effectively quenching its luminescence. For example, J. Heinze [*Synth. Met.* 43:2805 (1991)] reviews the well-known electrochemistry of conjugated polymers, which has demonstrated that in the presence of an electrolyte and an applied voltage such polymers can be reversibly doped with charge carriers whose charge is compensated by counterions from the electrolyte. A number of researchers, including S. Hayashi et al. [*Solid State Commun.* 61:249 (1987)], have noted that even at relatively low levels of a few mole percent, such electrochemical doping efficiently quenches the luminescence of the polymer.

Upon application of a voltage between the two electrodes of the present invention, the semiconductor in the layer of composite material is electrochemically oxidized to form p-type carriers at the anode. Said p-type carriers then propagate within the layer, under the influence of the field due to the applied voltage, toward the cathode. Similarly, the semiconductor in the layer of composite material is electrochemically reduced to form n-type carriers at the cathode which then propagate within the layer, under the influence of the field due to the applied voltage, toward the anode. Between the regions of n- and p-type carriers, the p-type carriers propagating toward the cathode and the n-type carriers propagating toward the anode meet in a region which defines the electrochemically induced p-n junction. The width of the electrochemically induced p-n junction may be either equal to or less than the thickness of the ionically conducting layer within the region of the electrochemically induced p-n junction, the n- and p-type carriers combine in the layer to form charge carrier pairs which decay radiatively to the neutral ground state of the semiconductor.

The ability to generate a p-n junction electrochemically, in-situ, offers particular advantages. Since the device is fabricated with the semiconductor in its neutral form and the electrochemically induced p-n junction is generated in-situ electrochemically, manufacturing and packaging are simpler and less demanding. When it is operated as a light emitting p-n junction, the dynamic electrochemically generated p-n junction is bipolar, by which is meant that reversing the applied voltage reverses the doping profile. The bipolar character, thus, enables the device to operate under either forward or reversed polarity. This is reflected in a comparison of the current-voltage characteristic curves of conventional static p-n junctions, well known in the art [see, e.g., S. M. Sze, *Physics of Semiconductor Devices*, Wiley & Sons, N.Y., 1981], with those of the present invention. The conventional static p-n junction is a diode, meaning that its current response to a swept applied voltage is asymmetric with respect to the polarity of the applied voltage. The result is a large rectification ratio (ratio of forward to reverse current), typically of order $10^3$–$10^8$. By contrast, the current response of the bipolar electrochemical light emitting device is more nearly symmetric, as demonstrated in FIGS. 3 and 7, and its rectification ratio is near unity.

The Composite Layer

The composite is a mixture of immobile semiconductor and ionic species source. The composite material preferably in the form of a layer of substantially uniform thickness. This is generally a thin layer and can range in thickness from about 5 nm to about 1 cm or more. In most applications thicknesses from about 5 nm to about 1 mm and particularly 10 nm to about 0.1 mm are employed. As a general rule, thinner layers are more commonly employed than thicker layers. Layers in the form of films, fibers, or other more complex shapes may be used including shapes whose dimensions fall outside this range.

The proportions of semiconductor and ionic species source can vary throughout the range which permits light to be emitted, for example from about 0.1:0.9 to about 0.9:0.1 on a weight basis. At the present time ranges of from about 0.2:0.8 to about 0.8:0.2 and especially from about 0.3:0.7 to about 0.7:0.3 are preferred.

The composite material may also comprise other materials or additives useful for facilitating the processing of said composite material or for enhancing its function in electrochemical light emitting devices. Such additives may include, for example, stabilizers, plasticizers, dyes, colorants, fillers, mechanical spacer particles, and the like. These materials are optional so can range from 0 to about 75% of the total of the layer.

The physical shape, form, or state of the matter of the semiconductor is not critical and may include homogeneous and heterogeneous blends with an ionic medium, mixtures and admixtures with an ionic medium, interpenetrating networks within an ionic medium, solid solutions with an ionic medium, gels swollen by a solvent which comprises ionic species, foams or porous structures further comprising an ionic medium, and the like, provided that said semiconductor is 'immobile' and further provided that said semiconductor supports both p- and n-type carriers which can propagate throughout the semiconductor and that the doping profile of the semiconductor can be dynamically changed in a controlled fashion through reversible electrochemical oxidation and reduction.

The electrochemical light emitting device may comprise more than one spatially separated region, each region further comprising different semiconductors, such that by changing the operating parameters of a device incorporating said separated regions the position of the p-n junction within the device may be moved among said regions. Thus, for example, in a light emitting structure the junction might be moved between regions comprising semiconductors with differing energy gaps so that light of different colors may be emitted.

The Semiconductor

The layer includes a semiconductor. In some of the preferred embodiments, the semiconductor is a polymer, said polymer further preferably comprising at least one conjugated polymer or a co-polymer which contains segments of p-conjugated moieties. Conjugated polymers are well known in the art [see, e.g., *Conjugated Polymers*, J.-L. Bredas and R. Silbey eds., Kluwer Academic Press, Dordrecht, 1991]. Suitable choices include, but are in no way limited to (i) poly(p-phenylene vinylene) and its derivatives substituted at various positions on the phenylene moiety;

(ii) poly(p-phenylene vinylene) and its derivatives substituted at various positions on the vinylene moiety;

(iii) poly(arylene vinylene), where the arylene may be such moieties as naphthalene, anthracene, furylene, thienylene, oxadiazole, and the like, or one of said moieties with functionalized substituents at various positions;

(iv) derivatives of poly(arylene vinylene), where the arylene may be as in (iii) above, substituted at various positions on the arylene moiety;

(v) derivatives of poly(arylene vinylene), where the arylene may be as in (iii) above, substituted at various positions on the vinylene moiety;

(vi) co-polymers of arylene vinylene oligomers with non-conjugated oligomers, and derivatives of such polymers substituted at various positions on the arylene moieties, derivatives of such polymers substituted at various positions on the vinylene moieties, and derivatives of such polymers substituted at various positions on the arylene and the vinylene moieties;

(vii) poly(p-phenylene) and its derivatives substituted at various positions on the phenylene moiety;

(viii) poly(arylenes) and their derivatives substituted at various positions on the arylene moiety;

(ix) co-polymers of oligoarylenes with non-conjugated oligomers, and derivatives of such polymers substituted at various positions on the arylene moieties;

(x) polyquinoline and its derivatives;

(xi) co-polymers of polyquinoline with p-phenylene and moieties having solubilizing function;

(xii) rigid rod polymers such as poly(p-phenylene-2,6-benzobisthiazole), poly(p-phenylene-2,6-benzobisoxazole), poly(p-phenylene-2,6-benzimidazole), and their derivatives, and the like.

Other suitable choices for the semiconducting component of the invention are small organic molecules, monomers, prepolymers, or oligomers which are semiconducting in their solid state and which can be processed into suitable blends or composites with an electrolyte, said small organic molecules being 'immobile' in the blends in the sense defined above. Laser dyes are one type of small molecule which has worked well in this application. These laser dyes can be present as small molecules or as polymer materials in which they are chemically bound or otherwise tethered to an immobilizing polymer.

The immobilization may be effected, for example, by forming a solid mixture of the semiconducting molecules, monomers, prepolymers, or oligomers in a suitable solid medium comprising ionic species, or by forming a physically or covalently cross-linked network of the semiconducting molecules or oligomers in a suitable medium comprising ionic species, or by physically or covalently bonding the semiconducting molecules or oligomers to a suitable immobile network comprised within the layer further comprising ionic species.

The Ionic Species Source

Ionic species may be provided by incorporation in the composite material of an electrolyte, by which is meant an ionically bound positively charged cation and negatively charged anion which ionize in a solvent or other suitable medium to render said solvent or medium electrically conducting.

In these electrochemical light emitting devices, suitable representative salts have cations which include the singly ionized alkali metals lithium, sodium, potassium, rubidium, and cesium; ions of the metals aluminum, silver, barium, calcium, cobalt, copper, chromium, zinc, and the like; metallo-organic cations; and organic cations such as ammonium, tetramethyl ammonium, tetraethyl ammonium, tetrapropyl ammonium, tetrabutyl ammonium, tetradecyl ammonium, tribenzyl ammonium, phenyl ammonium, and the like. Representative choices of anion include the singly ionized halogens fluorine, chlorine, bromine, and iodine; inorganic anions such as perchlorate, bromate, nitrate, sulfate, phosphate, tetrafluoroborate, hexafluorophosphate, aluminum tetrachlorate, and the like; and organic anions such as n-butyrate, trifluoromethane sulfonate, trifluoromethane sulfonamide, acetate, trifluoroacetate, tetraphenylborate, toluene sulfonate, dodecylbenzene sulfonate, camphor sulfonate, picrate, salicylate, thiocyanate, benzoate and the like. Mixtures comprising more than one cationic species and more than one anionic species may also be suitable for use in electrochemical light emitting devices.

In a preferred embodiment, the ionic species are provided by a polymer electrolyte. Polymer electrolytes are well known in the art [see, e.g., K. M. Abraham, *Highly Conductive Polymer Electrolytes in Applications of Electroactive Polymers*, B. Scrosati ed., Chapman & Hall, London, 1993] and consist of salt complexes of high polymers containing optimally spaced electron donor atoms or moieties which coordinately bond with the cation of the salt. Suitable examples of such polymers include poly(ethylene oxide), poly(propylene oxide), poly(dimethyl siloxane), polyoxymethylene, poly(epichlorohydran), poly (phosphazene), poly[bis-(methoxyethoxyethoxy) phosphazene], polyoxetane, polytetrahydrofuran, poly(1,3-dioxolane), poly(ethylene imine), poly(ethylene succinate), poly(ethylene sulfide), poly(propylene sulfide), poly[oligo (oxyethylene) oxymethylene], poly[oligo(oxyethylene) methacrylate], poly[oligo(oxyethylene) cyclotrisphosphazene] and the like, and mixtures thereof.

In another embodiment, the light emitting layer of an electrochemical light emitting device employs the salt of a conjugated polymer covalently bonded to a self-doping moiety. Suitable choices of such polymers include the salts of sulfonate and alkylsulfonate substituted polyarylenes, polyarylenevinylenes, and the like, such as poly(p-phenylene sulfonate), poly(3-alkylsulfonate-thiophene), poly(N-alkylsulfonate pyrrole), and the like, where alkyl is one of propyl, butyl, pentyl, hexyl, heptyl, octyl, decyl, undecyl, dodecyl, etc.

In another embodiment the electrochemical light emitting device may include a block or graft copolymer further comprising segments which function as polymer electrolytes and segments which contain p-conjugated moieties, such as oligoarylenes, oligoarylenes substituted at various positions on the arylene moiety, oligoarylene vinylenes, oligoarylene vinylenes substituted at various positions on the arylene moiety, oligoarylene vinylenes substituted at various positions on the vinylene moiety, oligoarylene vinylenes substituted at various positions on the arylene and the vinylene moiety, di-arylene polyenes, di-arylene polyenes substituted at various positions on the arylene moiety, di-arylene polydienes, di-arylene polydienes substituted at various positions on the arylene moiety, and the like.

Contact Layers

The devices of the invention have contact layers. These layers serve as electrodes for applying the powering voltage across the thin layer. These electrodes may be placed in contact with the layer of composite material by processing the admixture of the ionic species and the semiconducting material into a layer on a substrate bearing one electrode and then depositing a second electrode on the free surface of the layer.

Any material capable of forming an electrical pathway for the powering voltage to the thin layer may be employed as these contact layers. Typical materials include metals such as aluminum, silver, platinum, gold, palladium, tungsten, indium, copper, iron, nickel, zinc, lead and the like; metal oxides such as lead oxide, tin oxide, and the like; graphite; doped inorganic semiconductors such as silicon, germanium, gallium arsenide, and the like; and doped conducting polymers such as polyaniline, polypyrrole, polythiophene, and the like.

In a preferred embodiment of electrochemical light emitting devices at least one electrode consists of a semitransparent conductive material such as indium tin oxide, tin oxide, nickel, gold, doped polyaniline, doped polypyrrole, and the like. Preferably, such electrodes have a sheet resistance of about 10 to 1000 ohms per square and an optical transmittance of about 80% for wavelengths longer than about 400 nm.

Substrates and General Processing Conditions

Suitable substrates may be rigid or mechanically flexible and include glass, metals and alloys, and plastics. Typically the surface of the substrate which carries the thin layer has been coated with an appropriate electrode material. Admixtures may be processed from solutions of the ionic species and semiconductor in one or more solvents or mixtures of solvents, or from a thermally processible blend of the two materials, or by using an appropriate vacuum deposition technique. A second electrode may be placed in contact with the layer of composite material by deposition of a suitable solvent-borne material, or by thermal evaporation of a suitable material, or by electroless deposition of a suitable metal or alloy. Alternatively, both suitable electrodes may be placed in contact with a free-standing layer of the composite material by lamination.

In an embodiment of the present invention in which mechanically flexible substrates, electrodes, and packaging materials have been used, the electrochemical light emitting device may be mechanically flexible. Such devices may be useful for displays mounted on curved surfaces, such as are found on a number of appliances, automotive instrument panels, consumer electronics and the like. If it is compatible with the physical properties of the layer, post-shaping operations such as vacuum-forming may be used.

In a preferred embodiment comprising a polymer electrolyte and a semiconducting polymer, these polymers are preferably processible from the same organic solvent or a suitable mixture of solvents. Alternatively, the semiconducting polymer may be prepared by means of a chemical or thermal treatment of a processible precursor polymer. In a further preferred embodiment the solution processible precursor polymer is a polyelectrolyte, which may enhance intimate mixing of said precursor polymer with the polymer electrolyte. Suitable co-solutions of the components of the composite material may be processed into substantially uniform layers of appropriate thickness using a number of established techniques including spin coating, roll coating, screen printing, flexographic printing, meniscus coating, and the like.

In another preferred embodiment comprising a polymer electrolyte and a semiconducting polymer, said polymers are preferably processible from the melt such as, for example, by extrusion.

In another preferred embodiment comprising a semiconducting polymer and an electrolyte dissolved in a solvent, the semiconducting polymer forms a gel incorporating said electrolyte solution. Such gels may be formed, for example, by semiconducting polymers with moieties which may be physically or chemically cross-linked to form a network.

To construct displays of higher information content, electrochemical light emitting devices may be fabricated as arrays of individually addressable electrochemical light emitting devices. Such arrays may readily be produced by suitable patterning of either the electrodes or of the layer of composite material.

Electrochemical light emitting devices may further comprise additional materials or layers, for example, such as to exclude oxygen or moisture from the composite material, or for support, mounting, or decorative purposes, or to adjust the apparent color of the emitted light.

Optional Elements

If desired, one or each of the electrodes can include, in addition to the electrode material, a further layer or layers which serve to control the electrochemical potential of the reduction or oxidation reactions at the electrode and the double layer potential at the electrode. Such layers would serve to control the relative populations of n- and p-type carriers in the layer, thereby optimizing the doping profile of the electrochemically induced p-n junction upon application of a voltage.

The following Examples are set forth to further illustrate the present invention and should not be construed as limiting the spirit or scope of the invention.

EXAMPLE 1

Electrochemical light emitting devices were fabricated in the following way. A co-solution of the polymer poly (ethylene oxide), the polyelectrolyte poly(p-xylylidene tetrahydrothiophenium chloride), and the salt lithium triflate (LiCF$_3$SO$_3$) in a mixture of either acetonitrile and water (5:1 by volume) or acetonitrile and methanol (2:1 by volume) was prepared. The molar ratio of the CH$_2$CH$_2$O moieties in the poly(ethylene oxide) to the salt was approximately 20:1. Thin films of a 1:1 (by weight) blend of the two polymers were then deposited onto indium tin-oxide coated glass substrates either by spin coating or drip coating of the solution onto the substrates. The transparent electrically conducting layer of indium tin-oxide on the substrate served as one contact to the resulting ionically conducting layers. The thickness of the layers formed in this way ranged between about 500 angstroms and 1 mm, with excellent devices produced from films of about 5000 thickness. The layers were subsequently heated to approximately 100° C. for about 3 hours on a hot plate in a nitrogen atmosphere, in order to convert the poly(p-xylylidene tetrahydrothiophenium chloride) to the conjugated polymer poly(p-phenylene vinylene) through the thermal elimination of tetrahydrothiophene and hydrochloric acid. The coated substrates were then transferred into a thermal evaporator, in which a second contact was formed by evaporation of a 400 angstrom aluminum layer onto the surface of the ionically conducting layer opposite the substrate. Because the indium tin-oxide covered the entire surface of the substrates, the aluminum contacts, in the form of thin strips approximately 0.3 cm×1 cm, effectively defined the active light emitting area of the devices.

Upon application of a voltage between the indium tin-oxide and aluminum contacts, emission through the transparent contact of yellow-green light from the layer became visible in a lighted room at a voltage whose magnitude was less than 5 V. While this demonstrated that the devices will turn on at quite low effective powering voltages, higher voltages such as up to and including 10 or 20 volts or even unreduced line voltages of as much as 110 volts or even 220 volts can be used if desired.

Figure 1:
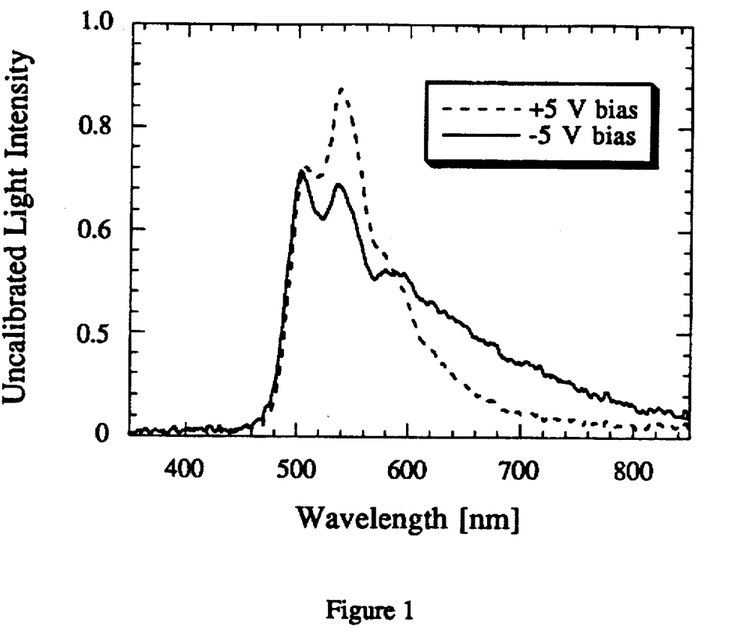
FIG. 1 is a graph that shows the electrochemically induced light emission as measured in Example 1 from a layer comprising the polymer poly(ethylene oxide), the conjugated polymer poly(p-phenylene vinylene), and the salt lithium triflate, said layer sandwiched between electrodes of indium tin-oxide and aluminum, and a voltage of +5 V or −5 V applied between said electrodes.

FIG. 1 also shows the spectrally resolved light output from the device upon application of a voltage of either polarity, demonstrating that the device is bipolar. The spectrum of emitted light is seen to be the same in either case, indicating that the emission is independent of which electrode serves as the anode and which serves as the cathode.

Figure 2:
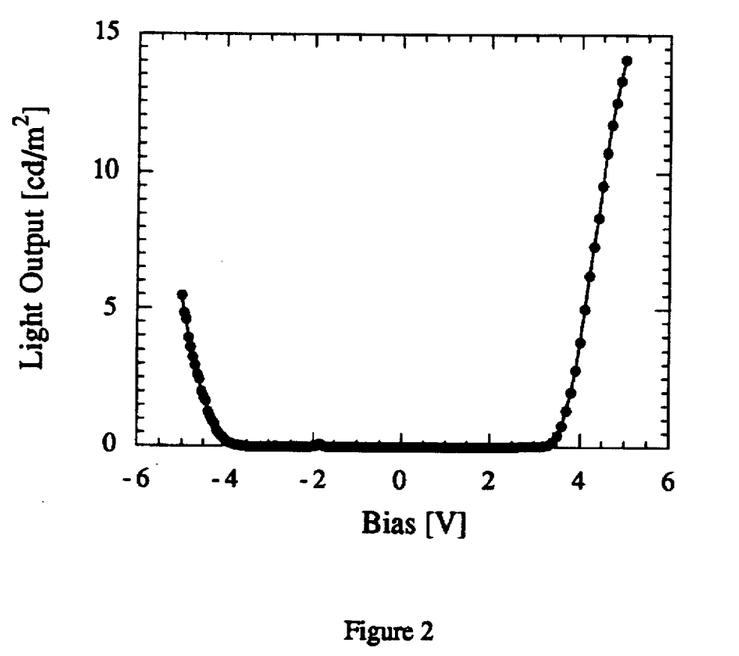
FIG. 2 is a graph that shows the intensity of light measured outside the electrochemical light emitting device of Example 1 for a range of voltages applied between the electrodes.
Figure 3:
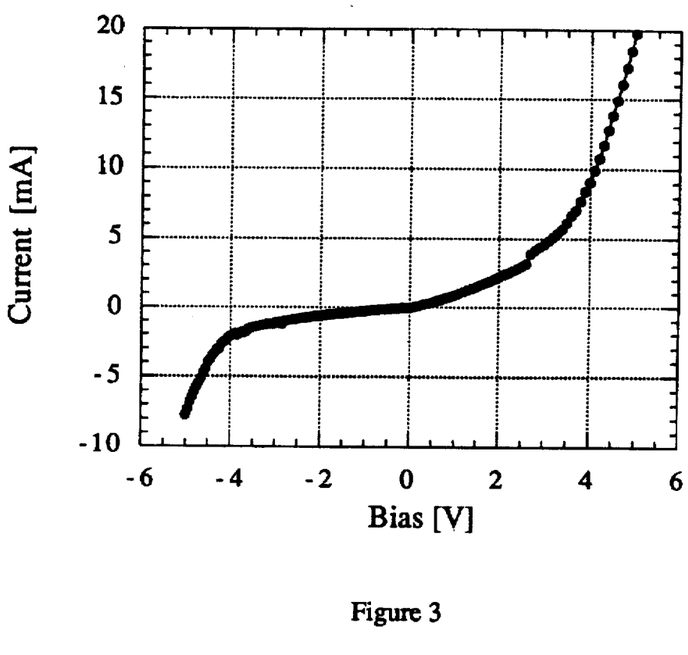
FIG. 3 is a graph that shows the current dram by the electrochemical light emitting device of Example 1 for a range of voltages applied between the electrodes.

FIG. 2 shows the applied voltage dependence of the light output from the device, while FIG. 3 shows the current drawn by the device. For positive voltages the indium tin-oxide contact served as the anode and the aluminum contact as the cathode, whereas for negative voltages the role of the two contacts was reversed. This further demonstrates the bipolar nature of these devices. The current versus voltage curve is nearly symmetric. The external quantum efficiency (photons emitted per electron supplied by the power source) of these devices was essentially independent of the voltage polarity. The device was operated in a dry and oxygen-free argon atmosphere under a continuous d.c. bias voltage of 5 V with light output observed over a period of several days. If the devices of the invention were optimized, turn on voltages as low as 1 or 2 volts should be possible.

Devices using layers with a variety of thicknesses in the range from 500 angstroms to 1 mm showed differences in performance. The switching speed and apparent threshold operating voltage increased with increasing layer thickness, and device efficiency increased with increasing layer thickness. This latter observation may indicate that in the devices with the thinnest layers the width of the electrochemically induced p-n junction region was equal to the width of the layer.

Figure 4:
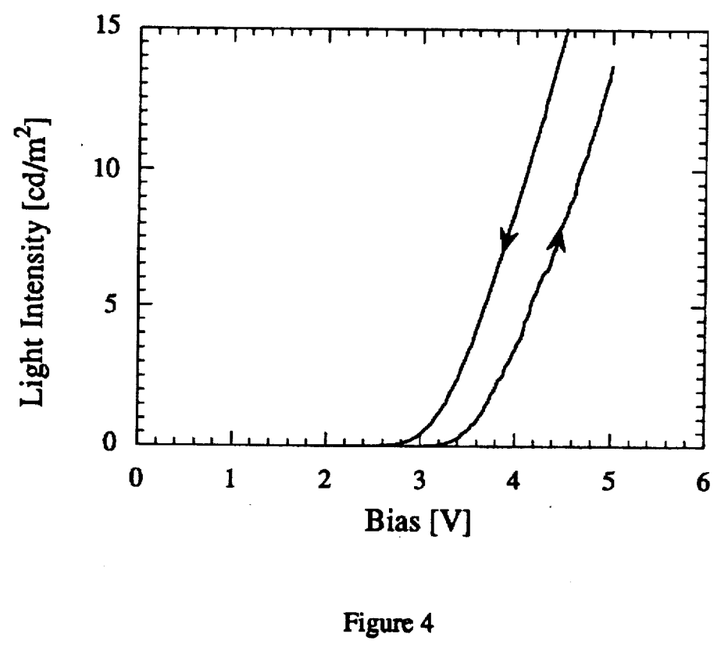
FIG. 4 is a graph that shows the intensity of light measured outside the electrochemical light emitting device of Example 1 for a range of voltages applied between the electrodes, said measurement being made as the applied voltage was swept at a rate of 67 mV/s either from 0 V to 5 V or from 5 V to 0 V, the direction indicated by the arrowheads on the graph.

The device current-voltage characteristics showed both a voltage scan rate dependence and hysteresis as a consequence of the dynamic nature of the electrochemical generation of the p-n junction. FIG. 4 shows the current-voltage characteristics for a scan rate of about 67 mV/s, both when the voltage is scanned from 0 to 5 V and when it is scanned from 5 to 0 V. For faster scan rates the apparent threshold voltage for light emission increases for increasing voltage scans and decreases for decreasing voltage scans. In addition, the perceived switching time varies depending on the cycle history of the device: the speed with which the light output appears in response to a transient voltage of a given polarity is slower if the device has been previously operated with a voltage of the opposite polarity than if it has been previously operated with one of the same polarity. These phenomena are all a result of the kinetics of the electrochemical generation and transport of n- and p-type carriers in the ionically conducting layer.

EXAMPLE 2

Electrochemical light emitting devices were fabricated in the following way. A co-solution in pyridine of the polymer poly(ethylene oxide), the conjugated polymer poly[2-methoxy,5-(2'-ethyl-hexyloxy)-1,4-phenylene vinylene], and the salt lithium triflate (LiCF$_3$SO$_3$) was prepared. The molar ratio of the CH$_2$CH$_2$O moieties in the poly(ethylene oxide) to the salt was approximately 20:1. Thin films of a 1:1 (by weight) blend of the two polymers were then deposited onto indium tin-oxide coated glass substrates either by spin coating or drip coating of the solution onto the substrates. The transparent electrically conducting layer of indium tin-oxide on the substrate served as one contact to the resulting ionically conducting layers. The thickness of the layers formed in this way ranged between about 500 angstroms and 1 mm. The coated substrates were transferred into a thermal evaporator, in which a second contact was formed by evaporation of a 400 angstrom aluminum layer onto the surface of the ionically conducting layer opposite the substrate. Because the indium tin-oxide covered the entire surface of the substrates, the aluminum contacts, in the form of thin strips approximately 0.3 cm×1 cm, effectively defined the active light emitting area of the devices.

Figure 5:
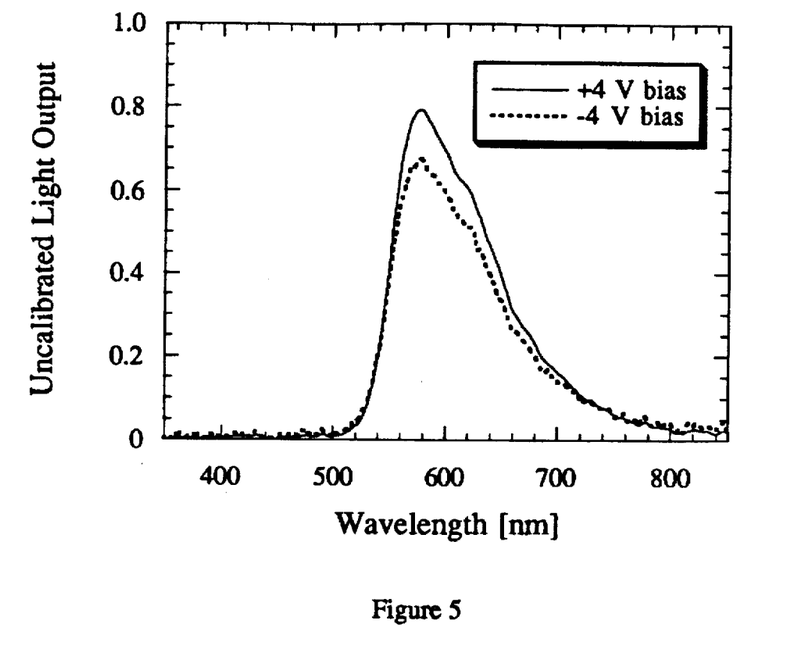
FIG. 5 is a graph of data determined in Example 2 which shows the electrochemically induced light emission from a layer comprising the polymer poly(ethylene oxide), the conjugated polymer poly[2-methoxy,5-(2'-ethyl-hexyloxy)-1,4-phenylene vinylene], and the salt lithium triflate, said layer sandwiched between electrodes of indium tin-oxide and aluminum, and a voltage of +4 V or −4 V applied between said electrodes.

Upon application of a voltage between the indium tin-oxide and aluminum contacts, emission through the transparent contact of yellow-orange light from the layer became visible in a lighted room at a voltage whose magnitude was less than 4 V. FIG. 5 shows the spectrally resolved light output from the device upon application of a voltage of either polarity, demonstrating that the device is bipolar. The spectrum of emitted light is seen to be the same in either case, indicating that the emission is independent of which electrode serves as the anode and which serves as the cathode.

Figure 6:
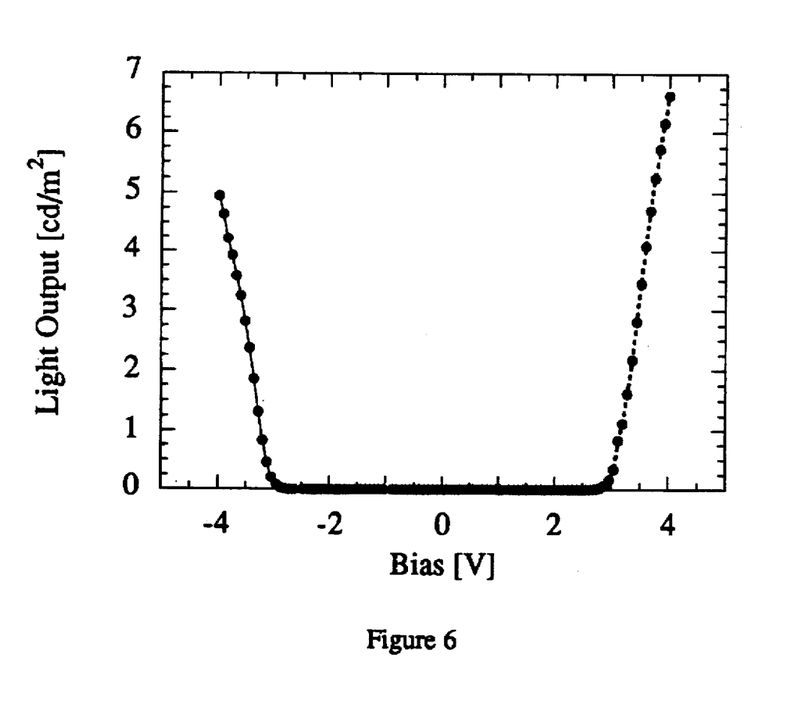
FIG. 6 is a graph that shows the intensity of light measured outside the electrochemical light emitting device of Example 2 for a range of voltages applied between the electrodes.
Figure 7:
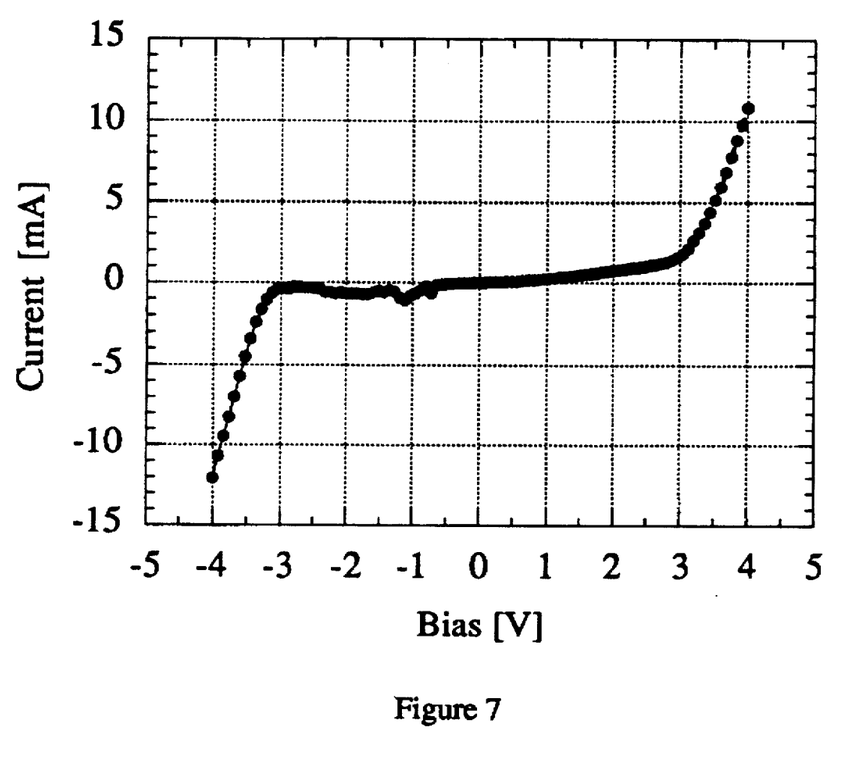
FIG. 7 is a graph that shows the current drawn by the electrochemical light emitting device of Example 2 for a range of voltages applied between the electrodes.

FIG. 6 shows the applied voltage dependence of the light output from the device, while FIG. 7 shows the current drawn by the device. As for the devices described in Example 1, these data demonstrate the bipolar nature of the present devices. The current versus voltage curve is again nearly symmetric. The external quantum efficiency (photons emitted per electron supplied by the power source) of these devices was essentially independent of the voltage polarity.

EXAMPLE 3

Electrochemical light emitting devices were prepared from a co-solution of the lithium salt of the polymer poly(ethylene oxide) and the laser dye Rhodamine 6G chloride in acetonitrile. Thin films of a 1.6:1 (polymer:dye by weight) blend of the polymer and the dye were then deposited onto indium tin-oxide coated glass substrates by spin coating the solution onto the substrates. In this Example, the network of dye aggregates within the host poly(ethylene oxide) layer served as the semiconductor. The transparent electrically conducting layer of indium tin-oxide on the substrate served as one contact to the ionically conducting polymer layer. The thickness of the layers formed in this way ranged between about 1000 angstroms and 1 mm. Following deposition of the layers, the coated substrates were transferred into a thermal evaporator, in which a second contact was formed by evaporation of an aluminum layer onto the top surface of the layer.

Upon application of a voltage between the indium tin-oxide and aluminum contacts, emission through the transparent contact of light from the layer was detected at a voltage whose magnitude was less than 15 V.

EXAMPLE 4

Electrochemical light emitting devices were prepared from a co-solution of the lithium salt of the polymer poly(ethylene oxide) and the laser dye Kiton red 620 in acetonitrile. Thin films of a 1.6:1 (polymer:dye by weight) blend of the polymer and the dye were then deposited onto indium tin-oxide coated glass substrates by spin coating the solution onto the substrates. In this Example, as in Example 2, the network of dye aggregates within the host poly(ethylene oxide) layer served as the semiconductor. The transparent electrically conducting layer of indium tin-oxide on the substrate served as one contact to the ionically conducting polymer layer. The thickness of the layers formed in this way ranged between about 1000 angstroms and 1 mm. The coated substrates were then transferred into a thermal evaporator, in which a second contact was formed by evaporation of an aluminum layer onto the top surface of the layer.

Upon application of a voltage between the indium tin-oxide and aluminum contacts, emission through the transparent contact of light from the layer was detected at a voltage whose magnitude was less than 6 V when indium tin-oxide was connected as the anode, and less than 14 V when aluminum was connected as the anode. The current-voltage characteristic curves showed a more significant asymmetry than those measured for the devices described in Examples 1 and 2. Light was detected for applied voltages of either polarity.

EXAMPLE 5

Electrochemical light emitting devices were prepared from a co-solution of 15 mg of the tetrabutyl ammonium salt of dodecylbenzene sulfonic acid and 20 mg of the conjugated polymer poly[2-methoxy,5-(2'-ethyl-hexyloxy)-1,4-phenylene vinylene] in 3 ml of xylenes. Thin films of a 1.3:1 (polymer:salt by weight) blend of the polymer and the salt were then deposited onto indium tin-oxide coated glass substrates by spin coating. In this Example, the conjugated polymer layer served both as the semiconductor and as the ionically conducting matrix for the tetrabutyl ammonium cations and dodecyl benzene sulfonate anions. The transparent electrically conducting layer of indium tin-oxide on the substrate served as one contact to the ionically conducting polymer layer. The thickness of the layers formed in this way ranged between about 1000 angstroms and 1 mm. The coated substrates were then transferred into a thermal evaporator, in which a second contact was formed by evaporation of an aluminum layer onto the top surface of the layer.

Upon application of a voltage between the indium tin-oxide and aluminum contacts, emission through the transparent contact of red orange light from the layer became visible in a lighted room at a voltage whose magnitude was less than 5 V. The current-voltage characteristic curves were nearly symmetric, as in the case of the devices described in Example 1. Light was detected for applied voltages of either polarity.

What is claimed is:

1. An electrochemical light emitting device comprising a pair of contact layers held in a spaced relationship to one another by an admixed composite thin layer comprising immobile semiconductor and ionic species source.

2. The device of claim 1 wherein the semiconductor is an organic semiconductor.

3. The device of claim 2 wherein the admixed composite is in the form of an open connected network of organic semiconductor filled with the ionic species source.

4. The device of claim 2 wherein the organic semiconductor is a polymeric semiconductor.

5. The device of claim 4 wherein the polymeric semiconductor is a conjugated polymeric semiconductor.

6. The device of claim 4 wherein the polymeric semiconductor is a non-conjugated polymer comprising π-conjugated moieties.

7. The device of claim 5 wherein the conjugated semiconductor comprises a homopolymer or copolymer having mer units selected from the group consisting of substituted and unsubstituted p-phenylene vinylene, substituted and unsubstituted p-phenylene, substituted and unsubstituted quinoline, substituted and unsubstituted p-phenylene-2,6-benzobisthiazole, substituted and unsubstituted p-phenylene-2,6-benzobisoxazole, substituted and unsubstituted p-phenylene-2,6-benzimidazole, substituted and unsubstituted arylene, and substituted and unsubstituted arylene vinylene, wherein arylene is naphthalene, anthracene, furylene, thienylene, pyrrole, oxadiazole, or isothianaphthene and mixtures thereof.

8. The device of claim 2 wherein the organic semiconductor comprises a conjugated semiconductor homooligomer or cooligomer having mer units selected from the group consisting of thiophene, phenylene, phenylene vinylene, pyrrole, acetylene, vinylene and derivatives and mixtures thereof.

9. The device of claim 2 wherein the organic semiconductor is a gel.

10. The device of claim 2 wherein the semiconductor is selected from laser dye and polymers and oligomers containing laser dye moieties.

11. The device of claim 1 wherein the ionic species source is admixed salt.

12. The device of claim 11 wherein the salt has a cation selected from the group consisting of the singly ionized alkali metals, lithium, sodium, potassium, rubidium, and cesium; ions of the metals aluminum, silver, barium, calcium, cobalt, copper, chromium, zinc; metallo-organic cations; and organic cations such as ammonium, tetramethyl ammonium, tetraethyl ammonium, tetrapropyl ammonium, tetrabutyl ammonium, tetradecyl ammonium, tribenzyl ammonium, phenyl ammonium, and mixtures thereof and an anion selected from the group consisting of singly ionized halogens, fluorine, chlorine, bromine, and iodine; inorganic anions such as perchlorate, bromate, nitrate, sulfate, phosphate, tetrafluoroborate, hexafluorophosphate, aluminum tetrachlorate; and organic anions such as n-butyrate, trifluoromethane sulfonate, trifluoromethane sulfonamide, acetate, trifluoroacetate, tetraphenylborate, toluene sulfonate, dodecylbenzene sulfonate, camphor sulfonate, picrate, salicylate, thiocyanate, benzoate, and mixtures thereof.

13. The device of claim 1 wherein the ionic species source comprises polymeric electrolyte.

14. The device of claim 13 wherein the polymeric electrolyte itself comprises a mixture of electrolyte polymer and salt.

15. The device of claim 14 wherein the electrolyte polymer comprises a homopolymer or copolymer having mer units selected from the group consisting of ethylene oxide, propylene oxide, dimethyl siloxane, oxymethylene, epichlorohydran, phosphazene, bis-(methoxyethoxyethoxy) phosphazene, oxetane, tetrahydrofuran, 1,3-dioxolane, ethylene imine, ethylene succinate, ethylene sulfide, propylene sulfide, oligo(oxyethylene) methacrylate, oligo (oxyethylene) oxymethylene, oligo(oxyethylene) cyclotrisphosphazene and mixtures thereof.

16. The device of claim 13 wherein the polymeric electrolyte is a gel.

17. An electrochemical light emitting device comprising a pair of contact layers held in a spaced relationship to one another by an admixed composite thin layer comprising immobile conjugated polymeric or oligomeric semiconductor and polymeric or oligomeric electrolyte ionic species source.

18. The device of claim 17 wherein the conjugated polymeric or oligomeric semiconductor comprises a homopolymer or copolymer having mer units selected from the group consisting of substituted and unsubstituted p-phenylene vinylene, substituted and unsubstituted p-phenylene, substituted and unsubstituted quinoline, substituted and unsubstituted p-phenylene-2,6-benzobisthiazole, substituted and unsubstituted p-phenylene-2,6-benzobisoxazole, substituted and unsubstituted p-phenylene-2,6-benzimidazole, substituted and unsubstituted arylene, and substituted and unsubstituted arylene vinylene, wherein arylene is naphthalene, anthracene, furylene, thienylene, pyrrole, oxadiazole, or isothianaphthene; or a homooligomer or cooligomer having mer units selected from the group consisting of thiophene, phenylene, phenylene vinylene, pyrrole, acetylene, vinylene and derivatives and mixtures thereof.

19. The electrochemical light emitting device of claim 17 wherein the polymeric electrolyte ionic species source itself comprises electrolyte polymer which is a homopolymer or copolymer having mer units selected from the group consisting of ethylene oxide, propylene oxide, dimethyl siloxane, oxymethylene, epichlorohydran, phosphazene, bis-(methoxyethoxyethoxy)phosphazene, oxetane, tetrahydrofuran, 1,3-dioxolane, ethylene imine, ethylene succinate, ethylene sulfide, propylene sulfide, oligo (oxyethylene) methacrylate, oligo(oxyethylene) oxymethylene, oligo(oxyethylene) cyclotrisphosphazene and mixtures thereof; admixed with salt.

20. The device of claim 1 wherein the thin layer is from about 5 nm to about 10 um thick.

21. The device of claim 1 wherein the weight proportions of immobile semiconductor and ionic species source in the admixed composite thin layer range are from about 0.1:0.9 to about 0.9:0.1.

22. The device of claim 1 wherein at least one of the contact layers is substantially transparent at the wavelength at which the device emits light.

23. The device of claim 22 wherein both of the contact layers are substantially transparent at the wavelength at which the device emits light.

24. The device of claim 1 wherein at least one of the contact layers is selected from the group consisting of a layer comprising aluminum, silver, platinum, gold, palladium, tungsten, indium, zinc, copper, nickel, iron, lead, lead oxide, tin oxide, indium tin-oxide, graphite, doped silicon, doped germanium, doped gallium arsenide, doped polyaniline, doped polypyrrole, doped polythiophene, and derivatives and mixtures thereof.

25. The device of claim 24 wherein both of the contact layers are selected from the group consisting of a layer comprising aluminum, silver, platinum, gold, palladium, tungsten, indium, zinc, copper, nickel, iron, lead, lead oxide, tin oxide, indium tin-oxide, graphite, doped silicon, doped germanium, doped gallium arsenide, doped polyaniline, doped polypyrrole, doped polythiophene, and derivatives and mixtures thereof.

26. The device of claim 1 wherein one of the first and second contact layers is also in contact with a supporting substrate.

27. The device of claim 1 wherein both the first and second contact layers is also in contact with a supporting substrate.

28. The device of claim 1 wherein at least one of the first and second contact layers is also in contact with a supporting substrate selected from the group consisting of a free standing polymer film, either rigid or flexible, an inorganic material, an inorganic glass, amorphous silicon, an inorganic single crystal, single crystal silicon, single crystal quartz, single crystal sapphire, and a metal.

29. The device of claim 17 wherein one of the first and second contact layers is also in contact with a supporting substrate.

30. The device of claim 17 wherein both the first and second contact layers is also in contact with a supporting substrate.

31. The device of claim 17 wherein at least one of the first and second contact layers is also in contact with a supporting substrate selected from the group consisting of a free standing polymer film, either rigid or flexible, an inorganic material, an inorganic glass, amorphous silicon, an inorganic single crystal, single crystal silicon, single crystal quartz, single crystal sapphire, and a metal.

32. An electrochemical light emitting device comprising a pair of contacts held in a spaced relationship to one another by a thin layer comprising a block or random copolymer containing segments which provide immobile semiconductor regions and segments which are an ionic species source.

33. A system for light emission comprising a power supply applying an effective powering voltage across a pair of anode and cathode contact layers held in a spaced relationship to one another by an admixed composite thin layer comprising immobile semiconductor and ionic species source, the effective powering voltage thereby reducing the immobile semiconductor at the cathode to form negatively charged excitations and oxidizing the immobile semiconductor at the anode to form positively charged excitations, said negatively charged excitations and positively charged excitations propagating in the thin layer under the influence of the applied voltage and combining to form charge carrier pairs which decay radiatively in the thin layer so that light is emitted from the layer.

34. The system of claim 33 wherein the powering voltage is between 0.1 and 110 volts.

35. The system of claim 33 wherein the thin layer is from about 5 nm to about 10 um thick, the admixed composite is an open connected network of immobile conjugated organic semiconductor filled with the ionic species source and the weight proportions of immobile conjugated organic semiconductor and ionic species source in the admixed composite thin layer range are from about 0.1:0.9 to about 0.9:0.1.

36. The system of claim 35 wherein the conjugated organic semiconductor is selected from the group consisting of homopolymers and copolymers having mer units selected from the group consisting of substituted and unsubstituted p-phenylene vinylene, substituted and unsubstituted p-phenylene, substituted and unsubstituted quinoline, substituted and unsubstituted p-phenylene-2,6-benzobisthiazole, substituted and unsubstituted p-phenylene-2,6-benzobisoxazole, substituted and unsubstituted p-phenylene-2,6-benzimidazole, substituted and unsubstituted arylene, and substituted and unsubstituted arylene vinylene, wherein arylene is naphthalene, anthracene, furylene, thienylene, pyrrole, oxadiazole, or isothianaphthene; and homooligomers and cooligomers having mer units selected from the group consisting of thiophene, phenylene, phenylene vinylene, pyrrole, acetylene, vinylene and derivatives and mixtures thereof.

37. The system of claim 35 wherein the ionic species source is admixed salt.

38. The system of claim 37 wherein the salt has a cation selected from the group consisting of the singly ionized alkali metals, lithium, sodium, potassium, rubidium, and cesium; ions of the metals aluminum, silver, barium, calcium, cobalt, copper, chromium, zinc; metallo-organic cations; and organic cations such as ammonium, tetramethyl ammonium, tetraethyl ammonium, tetrapropyl ammonium, tetrabutyl ammonium, tetradecyl ammonium, tribenzyl ammonium, phenyl ammonium, and mixtures thereof and an anion selected from the group consisting of singly ionized halogens, fluorine, chlorine, bromine, and iodine; inorganic anions such as perchlorate, bromate, nitrate, sulfate, phosphate, tetrafluoroborate, hexafluorophosphate, aluminum tetrachlorate; and organic anions such as n-butyrate, trifluoromethane sulfonate, trifluoromethane sulfonamide, acetate, trifluoroacetate, tetraphenylborate, toluene sulfonate, dodecylbenzene sulfonate, camphor sulfonate, picrate, salicylate, thiocyanate, benzoate, and mixtures thereof.

39. The system of claim 35 wherein the ionic species source comprises polymeric electrolyte.

40. The system of claim 39 wherein the polymeric electrolyte comprises a mixture of salt and an electrolyte polymer selected from homopolymers and copolymers having mer units selected from the group consisting of ethylene oxide, propylene oxide, dimethyl siloxane, oxymethylene, epichlorohydran, phosphazene, bis-(methoxyethoxyethoxy) phosphazene, oxetane, tetrahydrofuran, 1,3-dioxolane, ethylene imine, ethylene succinate, ethylene sulfide, propylene sulfide, oligo(oxyethylene) methacrylate, oligo(oxyethylene) oxymethylene, oligo(oxyethylene) cyclotrisphosphazene and mixtures thereof.

41. The system of claim 33 wherein at least one of the contact layers is substantially transparent at the wavelength at which the device emits light such that the light is emitted through the substantially transparent contact layer.

42. The system of claim 34 wherein the powering voltage is less than 5 volts.

43. The system of claim 33 characterized by being capable of emitting polarized visible light.

44. The system of claim 33 wherein the pair of anode and cathode contact layers held in a spaced relationship to one another by an admixed composite thin layer are together in the form of a film.

45. The system of claim 33 wherein the pair of anode and cathode contact layers held in a spaced relationship to one another by an admixed composite thin layer are together in the form of a filament.

46. A process for generating useful levels of light comprising
applying an effective powering voltage across a pair of anode and cathode contact layers held in a spaced relationship to one another by an admixed composite thin layer comprising immobile semiconductor and ionic species source, the effective powering voltage thereby reducing the immobile semiconductor at the cathode to form negatively charged excitations and oxidizing the immobile semiconductor at the anode to form positively charged excitations, said negatively charged excitations and positively charged excitations migrating in the thin layer under the influence of the applied voltage and combining to form charge carrier pairs which decay radiatively in the thin layer so that light is emitted from the layer and
using the emitted light.

47. The process of claim 46 wherein the powering voltage is between 2 and 10 volts.

48. The process of claim 46 wherein the thin layer is from about 5 nm to about 10 um thick, the admixed composite is an open connected network of immobile conjugated organic semiconductor filled with the ionic species source and the weight proportions of immobile conjugated organic semiconductor and ionic species source in the admixed composite thin layer range are from about 0.1:0.9 to about 0.9:0.1.

49. The process of claim 48 wherein the conjugated organic semiconductor is selected from the group consisting of homopolymers and copolymers having mer units selected from the group consisting of substituted and unsubstituted p-phenylene vinylene, substituted and unsubstituted p-phenylene, substituted and unsubstituted quinoline, substituted and unsubstituted p-phenylene-2,6-benzobisthiazole, substituted and unsubstituted p-phenylene-2,6-benzobisoxazole, substituted and unsubstituted p-phenylene-2,6-benzimidazole, substituted and unsubstituted arylene, and substituted and unsubstituted arylene vinylene, wherein arylene is naphthalene, anthracene, furylene, thienylene, pyrrole, oxadiazole, or isothianaphthene; and homooligomers and cooligomers having mer units selected from the group consisting of thiophene, phenylene, phenylene vinylene, pyrrole, acetylene, vinylene and derivatives and mixtures thereof.

50. The process of claim 48 wherein the ionic species source is admixed salt.

51. The process of claim 50 wherein the salt has a cation selected from the group consisting of the singly ionized alkali metals, lithium, sodium, potassium, rubidium, and cesium; ions of the metals aluminum, silver, barium, calcium, cobalt, copper, chromium, zinc; metallo-organic cations; and organic cations such as ammonium, tetramethyl ammonium, tetraethyl ammonium, tetrapropyl ammonium, tetrabutyl ammonium, tetradecyl ammonium, tribenzyl ammonium, phenyl ammonium, and mixtures thereof and an anion selected from the group consisting of singly ionized halogens, fluorine, chlorine, bromine, and iodine; inorganic anions such as perchlorate, bromate, nitrate, sulfate, phosphate, tetrafluoroborate, hexafluorophosphate, aluminum tetrachlorate; and organic anions such as n-butyrate, trifluoromethane sulfonate, trifluoromethane sulfonamide, acetate, trifluoroacetate, tetraphenylborate, toluene sulfonate, dodecylbenzene sulfonate, camphor sulfonate, picrate, salicylate, thiocyanate, benzoate, and mixtures thereof.

52. The process of claim 48 wherein the ionic species source comprises polymeric electrolyte.

53. The process of claim 52 wherein the polymeric electrolyte itself comprises a mixture of salt and an electrolyte polymer selected from homopolymers and copolymers having mer units selected from the group consisting of ethylene oxide, propylene oxide, dimethyl siloxane, oxymethylene, epichlorohydran, phosphazene, bis-(methoxyethoxyethoxy)phosphazene, oxetane, tetrahydrofuran, 1,3-dioxolane, ethylene imine, ethylene succinate, ethylene sulfide, propylene sulfide, oligo(oxyethylene) methacrylate, oligo(oxyethylene) oxymethylene, oligo(oxyethylene) cyclotrisphosphazene and mixtures thereof.

54. The process of claim 48 wherein at least one of the contact layers is substantially transparent at the wavelength at which the device emits light such that the light is emitted through the substantially transparent contact layer.

55. The process of claim 48 wherein the powering voltage is less than 5 volts.

56. The process of claim 48 characterized by being capable of emitting polarized visible light.

57. The process of claim 48 wherein the pair of anode and cathode contact layers held in a spaced relationship to one another by an admixed composite thin layer are together in the form of a film.

58. The process of claim 48 wherein the pair of anode and cathode contact layers held in a spaced relationship to one another by an admixed composite thin layer are together in the form of a filament.

* * * * *